US006989554B2

(12) United States Patent
Schrödinger

(10) Patent No.: US 6,989,554 B2
(45) Date of Patent: Jan. 24, 2006

(54) CARRIER PLATE FOR OPTO-ELECTRONIC ELEMENTS HAVING A PHOTODIODE WITH A THICKNESS THAT ABSORBS A PORTION OF INCIDENT LIGHT

(75) Inventor: Karl Schrödinger, Berlin (DE)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 10/281,023

(22) Filed: Oct. 25, 2002

(65) Prior Publication Data

US 2004/0021144 A1 Feb. 5, 2004

(30) Foreign Application Priority Data

Aug. 2, 2002 (DE) ........................................ 102 36 376

(51) Int. Cl.
*H01L 27/15* (2006.01)

(52) U.S. Cl. ............................ 257/79; 257/81; 257/82

(58) Field of Classification Search .................. 257/79, 257/81, 82, 184–201
See application file for complete search history.

(56) References Cited

U.S. PATENT DOCUMENTS 3,946,423 A * 3/1976 Augustine
4,689,652 A * 8/1987 Shimada et al. ............ 257/443
5,701,374 A 12/1997 Makiuchi
6,037,644 A 3/2000 Daghighian et al.
6,483,130 B1 * 11/2002 Yang et al. ................. 257/189
6,591,754 B1 * 7/2003 Baur et al. .................. 102/206

FOREIGN PATENT DOCUMENTS

| | | | |
|---|---|---|---|
| DE | 195 27 026 | C2 | 2/1997 |
| DE | 101 42 531 | A1 | 3/2003 |
| EP | 0 388 161 | A2 | 9/1990 |
| JP | 63 269 580 | A | 11/1988 |
| WO | 03/019659 | A2 | 3/2003 |

* cited by examiner

*Primary Examiner*—Fetsum Abraham
(74) *Attorney, Agent, or Firm*—Laurence A. Greenberg; Werner H. Stemer; Ralph E. Locher

(57) ABSTRACT

A carrier for opto-electronic elements has a carrier plate that is transparent to emitted or absorbed light of an opto-electronic element that is allocated to the carrier. At least one semiconductor structure is inventively deposited on the carrier plate and forms at least one photodiode, whereby the semiconductor structure at least partly absorbs light impinging on the carrier plate. This makes light detection possible in a simple and highly integrated fashion. A transmitting device and a receiving device can be formed with this kind of carrier.

30 Claims, 3 Drawing Sheets

CARRIER PLATE FOR OPTO-ELECTRONIC ELEMENTS HAVING A PHOTODIODE WITH A THICKNESS THAT ABSORBS A PORTION OF INCIDENT LIGHT

BACKGROUND OF THE INVENTION

FIELD OF THE INVENTION

The present invention relates to a carrier for opto-electronic elements, an optical transmitter, and an optical receiver with such a carrier. The opto-electronic element contains a carrier plate that is transparent to emitted or received light of the opto-electronic element that is allocated to the carrier.

The monitoring of transmission power and wavelength of a laser diode by a monitor diode is known. For edge-emitting lasers, a monitor diode is typically mounted on the back-side mirror of the resonator. But for vertically emitting lasers (VCSEL), this is impossible. With vertically emitting lasers it is therefore necessary to divert a portion of the emitted light onto the monitor diode. This is disadvantageously associated with a relatively large outlay. Accordingly, in multi-channel transmitter modules (parallel optical link) it has not been possible to utilize a separate monitor diode for each channel for monitoring purposes.

As an alternative to diverting a portion of the emitted light, what is known as a reference laser can be utilized, which has the same characteristics as the actual laser that transmits a signal. But in this case, aging characteristics cannot be compensated.

German Patent DE 195 27 026 C2 describes an opto-electronic transducer in which a semiconductor component that transmits or receives light is mounted on a carrier plate in which the beam shaping structures are integrated.

SUMMARY OF THE INVENTION

It is accordingly an object of the invention to provide a carrier for opto-electronic elements, an optical transmitter, and an optical receiver that overcomes the above-mentioned disadvantages of the prior art devices of this general type, with which the transmitted or received light of an opto-electronic component can be detected in a simple fashion. In particular, a transmitting device and a receiving device will be proposed, which make photo detection possible for a number of opto-electronic elements easily and optimally independently.

With the foregoing and other objects in view there is provided, in accordance with the invention, a carrier for opto-electronic elements. The carrier contains a carrier plate that is transparent to emitted or received light from an opto-electronic element associated with the carrier plate, and at least one semiconductor structure deposited on the carrier plate. The semiconductor structure forms at least one photodiode and at least partly absorbs incident light.

The inventive solution is based on the idea of expanding the functionality of the carrier that usually serves for fastening and conductively contacting opto-electronic elements, such that a structure that is deposited on the carrier plate forms one or more photodiodes. Because the carrier is transparent and is penetrated by the light being emitted or received by an opto-electronic element, light can be easily detected by the photodiode without additional beam branching devices or the like. The desired light absorption can be set by suitably setting the layer thickness of the semiconductor structure.

The semiconductor structure contains at least two semiconductor layers, which form at least one photodiode. In a preferred development, the semiconductor structure has a layer with good conductivity, which is formed at least partly on one side of the carrier plate, a first semiconductor layer, and a second semiconductor layer.

The first semiconductor layer and the second semiconductor layer thus form the PN junction of the photodiode. The layer with good conductivity supplies the backside contact for the semiconductor layer adjoining the carrier plate.

The layer with good conductivity is preferably formed by a heavily doped semiconductor material, particularly a heavily doped silicon. Together with the two other semiconductor layers, it can form respective heavily doped p and n layers and an intermediate lightly doped or intrinsic semiconductor layer as in PIN photodiodes. But the layer with good conductivity can also be a simple metallization contact that is adjoined by a PN-diode.

At least one respective metallization contact is advantageously provided on individual layers of the semiconductor structure, by way of which the respective layer and the overall photodiode are conductively contacted. To the extent that the semiconductor structure forms several photodiodes, each photodiode, specifically the relevant layers, contains separate contacts, so that the signal of each photodiode can be detected independently.

In a preferred development, the photodiode is part of an optical receiver. Because such a photodiode should completely absorb incident light, the thickness of the semiconductor layer is selected such that incident light is substantially fully absorbed. In an alternative development, the photodiode is a monitor diode of an optical transmitter, whereby the semiconductor structure only partly absorbs light impinging on the carrier plate.

The carrier plate preferably is formed of glass, quartz, plastic, sapphire, diamond or a semiconductor material that is transparent to the radiation of the allocated opto-electronic element.

The invention provides that an antireflection layer may be applied to at least one side of the carrier plate and/or the semiconductor structure, namely on the outside surfaces of the carrier and between the semiconductor structure and the carrier plate. This minimizes losses due to reflection and backscatter.

Conductive tracks and appertaining contact pads are advantageously formed on the carrier plate and/or on the semiconductor structure, which serve for the mounting and conductive contacting of the electrical and/or opto-electronic elements on the carrier. To the extent that the conductive tracks are formed on the semiconductor structure, an isolating layer, for instance an oxide layer, is advantageously deposited on the semiconductor structure.

The semiconductor structure can be deposited on the carrier plate by any chemical and/or physical deposition technique, for instance epitaxy, chemical vapor deposition (CVD), vapor deposition or sputtering. What is essential is that the semiconductor structure is an integral component of the carrier and not merely mounted on the carrier plate.

In a preferred development, the carrier forms a plurality of photodiodes in a one-dimensional or two-dimensional array, with a transmission element allocated to each. The plurality of photodiodes is advantageously provided by isolating individual regions of the semiconductor structure following its deposition on the carrier plate by sawing, etching or the like, and separately contacting the regions. It is also imaginable for several semiconductor structures to be separately deposited next to one another on the carrier plate.

The invention also relates to an optical transmitting device with at least one light-emitting opto-electronic element and at least one monitor diode. The carrier is provided, whereby the monitor diode is integrated in the semiconductor structure of the carrier, and the beam emission surface of the light-emitting element faces the carrier, so that light that is emitted by the element passes through the photodiode and the transparent carrier plate. The emitted light can pass through the semiconductor layer or the carrier first, depending on the orientation of the carrier. A monitoring of the light passing though the carrier occurs automatically to a certain extent and without additional light deflecting devises, beam splitters, etc.

The invention also provides that the carrier plate forms or contains a beam shaping element, particularly a lens, on the side which is averted from the semiconductor structure, so that light exiting the carrier plate undergoes beam shaping, for instance being focused onto the butt of the optical waveguide.

The element is advantageously fastened on the carrier and conductively connected to tracks of the carrier, for instance by flip chip mounting or conventional bonding techniques. In principle, however, the element can also be fastened to some other structure. The invention provides that additional electrical or opto-electronic components may also be fastened to the carrier and conductively connected to interconnects of the carrier.

In a preferred development, several light emitting semiconductor elements are combined into a transmission array, and an array of monitor diodes in the semiconductor structure is allocated to the transmission array, whereby each monitor diode receives the light from a semiconductor element, respectively. This makes possible an individual monitoring of the individual lasers of the array.

Lastly, the invention relates to an optical receiving device with at least one optical receiver containing a photodiode and an electrical preamplifier. The inventive carrier is provided. The photodiode is integrated into the semiconductor structure of the carrier, and the electrical preamplifier is fastened to the carrier. The semiconductor structure absorbs incident light substantially completely. A plurality of photodiodes is again disposed in a one-dimensional or two-dimensional array.

Other features which are considered as characteristic for the invention are set forth in the appended claims.

Although the invention is illustrated and described herein as embodied in a carrier for opto-electronic elements, an optical transmitter, and an optical receiver, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
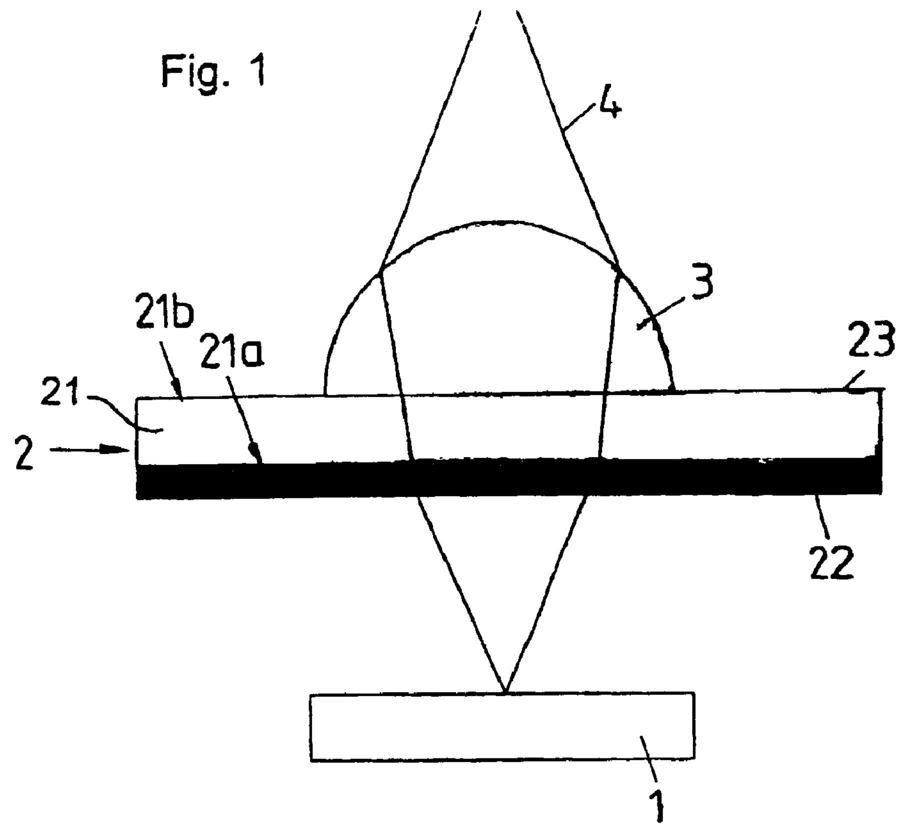
FIG. 1 is a diagrammatic, side-elevational view of a principal structure of a transmitting device with a carrier that forms a semiconductor structure according to the invention.

Referring now to the figures of the drawing in detail and first, particularly, to FIG. 1 thereof, there is shown a diagrammatic representation of an optical transmitting device with a light-emitting optical radiation element 1 and a carrier 2. The carrier 2 contains a transparent carrier plate 21 and a semiconductor structure 22. A lens 3 is also provided, and disposed on a side of the transparent carrier plate 21 that is averted from the optical radiation element 1, or being formed in one piece with the plate 21. A beam path 4 of light that is emitted by the optical radiation element 1 is schematically represented.

Figure 3:
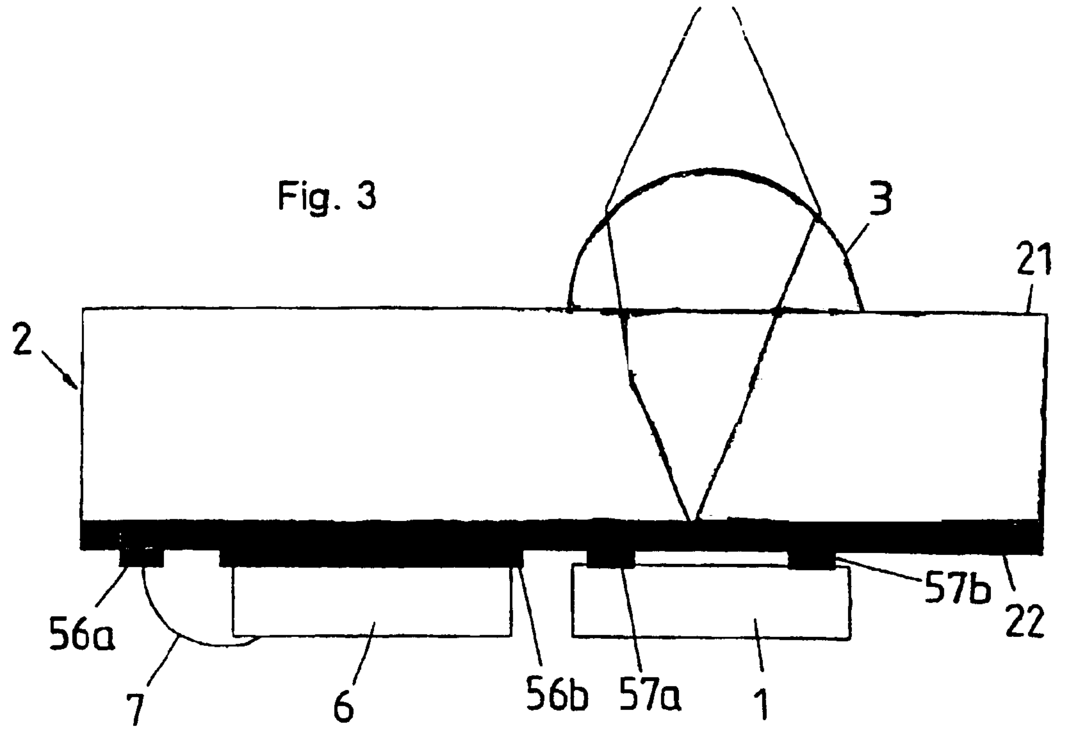
FIG. 3 is a side-elevational view of the transmitting device with the carrier that forms the semiconductor structure, whereby a laser diode and an integrated circuit are fastened on the semiconductor structure.
Figure 4:
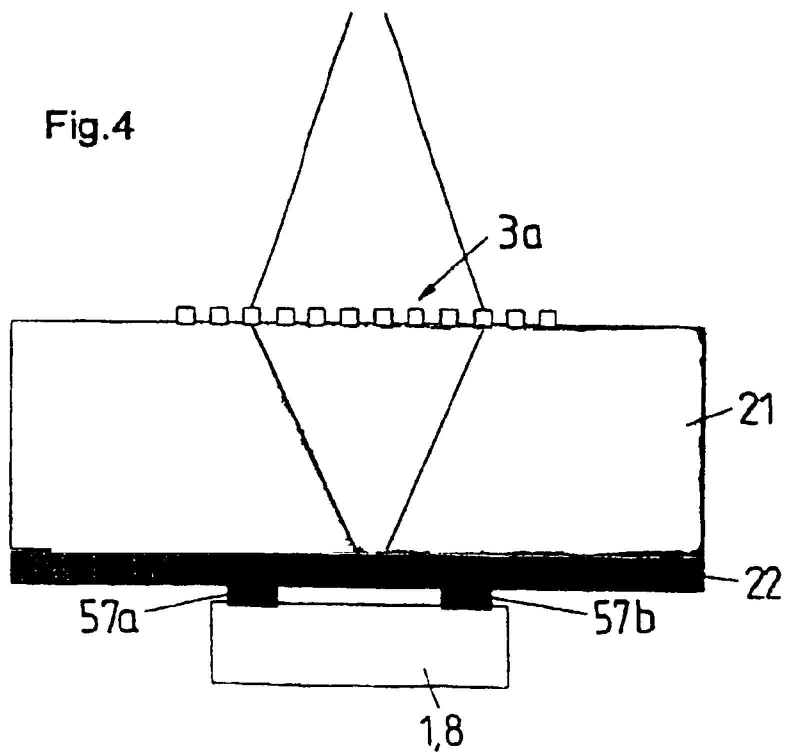
FIG. 4 is a side-elevational view of the transmitting device shown in FIG. 3, in which a Fresnel lens is employed as a beam-shaping element.
Figure 5:
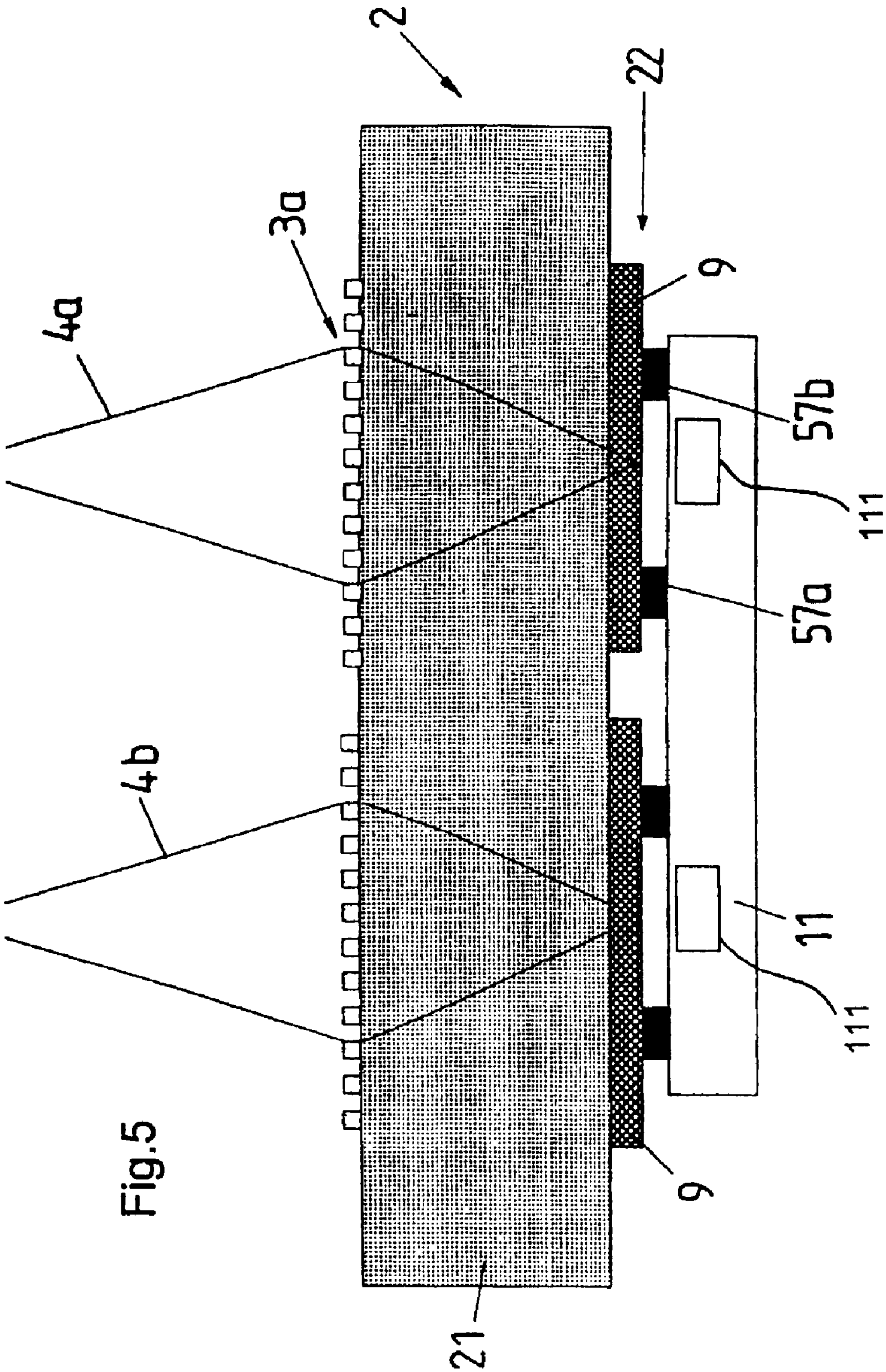
FIG. 5 is a side-elevational view of the transmitting device in which an array of laser diodes is allocated to an array of monitor diodes.

The optical radiation element 1 is advantageously a light-emitting semiconductor component, particularly a surface imitating laser diode (VCSEL) that provides a coherent light source. A driver module is allocated to the laser diode 1, which is not represented but which modulates the light of the laser diode 1 in correspondence to a data signal that is to be transmitted. The optical radiation element 1 can be directly fastened on the carrier 2 and conductively connected to interconnects that are constructed on the carrier 2, as represented in FIGS. 3 to 5. But it is also possible for the optical radiation element 1 to be fastened to some other structure, such as a housing that also includes the transparent carrier 2.

The carrier plate 21 of the carrier 2 is transparent to the light that is emitted by the optical radiation element 1. To that end, the carrier plate 21 is formed of glass, quartz, plastic sapphire, diamond, or a semiconductor material that is permeable to the radiation that is emitted by the optical radiation element 1. GaAs can be utilized for wavelengths above 900 $\mu$m, and silicon for wavelengths above 1100 $\mu$m.

The carrier plate 21 has a cuboidal shape and contains a top side 21*a* which faces the optical radiation element 1 and a bottom side 21*b* which is averted from the optical radiation element 1. The collecting lens 3 is constructed on the bottom side 21*b* of the carrier plate 21. The collecting lens 3 can be formed of the same material as the carrier plate 21 and can have a monolithic structure with the carrier plate 21. But it is just as possible for the lens 3 to be provided as a separate part which is fastened on the bottom side 21*b* of the carrier plate 21, for instance by gluing. The lens 3 can also have a different relative refractive index than the carrier plate 21.

At the top side 21*a* of the carrier plate 21, the semiconductor structure 22 is revealed. The structure 22 contains several layers that are deposited on the transparent carrier plate 21. Known chemical and/or physical deposition techniques can be employed to deposit or apply the individual layers of the semiconductor structure 22. For instance, the individual layers of the semiconductor structure can be applied to the carrier plate by epitaxy. But other methods, such as CVD, vapor deposition, or sputtering, are also possible.

The semiconductor structure 22 that is deposited on the carrier plate 21 forms at least one photodiode.

The semiconductor structure 22 is partly transparent to the light that is emitted by the optical radiation element 1. The photodiode that is formed in the semiconductor structure 22 advantageously represents a monitor diode, which partially detects the light which is emitted by the optical radiation element 1 and feeds it to a non-illustrated control device for controlling the wavelength and/or intensity of the light that is emitted by the optical radiation element 1. Integrating the monitor diode into the carrier 2 that receives the light from the optical radiation element 1 makes it possible to monitor the emitted light without substantially influencing the optical path. The occurring attenuation can even be used with advantage to the optical characteristics of the module in certain circumstances. An example of this derives from the fact that lasers for higher speeds are driven with high currents. The correspondingly higher light power must then be reduced, because the power must have an upper limit for purposes of laser safety. The required attenuation can be produced by the semiconductor structure instead of a separate attenuating disk.

The measure of attenuation (i.e. absorption) is determined by the thickness of the semiconductor structure 22. For instance, the depth of penetration is approximately 10 $\mu$m for silicon. Accordingly, when the semiconductor structure is made from silicon, it has a thickness of less than 10 $\mu$m, whereby merely a small fraction (less than 20%) of the light that is emitted by the optical radiation element 1 is absorbed.

It should be noted that the semiconductor structure 22 does not have to cover the top side 21*a* of the transparent carrier plate 21 completely. This being the case shown in FIG. 2, the carrier 2 as a whole is cuboidal.

Figure 2:
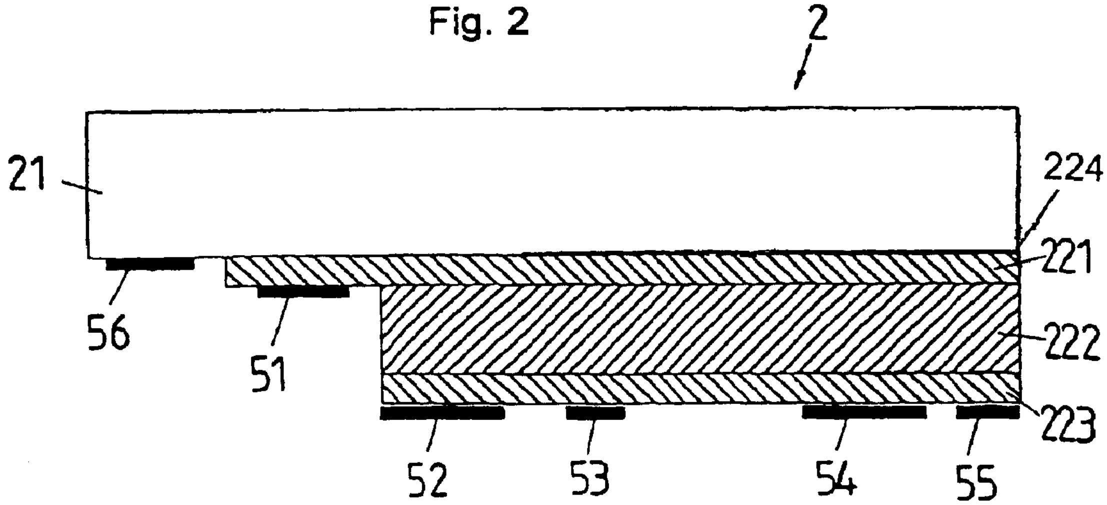
FIG. 2 is an enlarged sectional view of the semiconductor structure shown in FIG. 1.

FIG. 2 exemplarily represents the semiconductor structure 22 of the carrier 2. It should be noted that the semiconductor structure 22 can also be constructed some other way. What is essential is that the individual layers of the semiconductor structure 22 form the photodiode.

According to FIG. 2, the semiconductor structure 22 contains a layer with good conductivity 221, a first semiconductor layer 222, and a second semiconductor layer 223. The layer 221 with good conductivity is applied directly on the transparent carrier plate 21, whereby an additional antireflection layer 224 can be applied between the conductive layer 221 and the carrier plate 21 in order to minimize losses owing to reflection and backscatter.

In this exemplifying embodiment, the layer 221 with good conductivity is a heavily doped silicon layer or other semiconductor layer such as an n+ doped layer. It contains a metallization contact 51 by way of which the layer 221 is charged with an electrical voltage or ground. The contact 51 represents one or both of the contacts of the photodiode that is formed by the semiconductor structure 22. Owing to the good conductivity, the layer 221 forms the backside contact for the adjoining semiconductor layer 222.

The two semiconductor layers 222, 223 that are applied on the conductive layer 221 form a PN junction. They are applied to the carrier plate 21 and the layer with good conductivity 221, respectively, by epitaxy or some other method. The middle semiconductor layer 222 is lightly n-doped or forms an intrinsic layer, for example. The outer semiconductor layer 223 is p-doped, for example. The construction corresponds to that of a known PIN photodiode.

It should be noted that the layer 221 with good conductivity protrudes beyond the two other layers 222, 223 somewhat, in order to create space for the contact 51. Additional metallization contacts 52, 53, 54, 55 are formed on the outside of the outer semiconductor layer 223. The contacts provide the second contact of the photodiode. On the other hand, they serve as interconnects for mounting an opto-semiconductor or integrated circuit, which are fastened on the semiconductor structure 22. If the contacts 52 to 55 are to be isolated from one another, an oxide layer—which is common in semiconductor technology—can be applied to the bottom semiconductor layer 223.

The application of an oxide layer on the outer semiconductor layer is also provided in the following exemplifying embodiments, in any case as long as mutually isolated interconnects extend on the outer semiconductor layer.

In FIG. 2 another metallization 56 is realized directly on the transparent carrier plate 21 and stands schematically for additional interconnects on the carrier plate 2 for conductively contacting additional components that are fastened to the carrier plate 21.

FIG. 3 represents an exemplifying embodiment in which the optical radiation element 1 and an integrated circuit 6 are fastened on the semiconductor structure 22. The integrated circuit 6 is the drive circuit for the optical radiation element 1, for example. On the semiconductor structure 22 are metallizations 56*a*, 56*b*, 57*a*, 57*b* for contacting the optical radiation element 1 and the integrated circuit 6. The optical radiation element 1 is connected to the metallizations 57*a*, 57*b* by flip chip mounting, so that both contacts point to the carrier 2. The integrated circuit 6, on the other hand, is represented in a conventionally mounted form (bond wires 7 on the side that is averted from the mounting surface), but the mounting can also occur as with the opto-semiconductor 1. These contacting techniques are merely exemplary. The two elements 1, 6 can just as well be joined to the appertaining contacts 56*a*, 56*b*, 57*a*, 57*b* on the carrier 2 by conventional methods such as a bonding technique or flip chip assembly.

FIG. 4 represents an exemplifying embodiment in which the lens is constructed not as a lens with a spherical surface as in FIGS. 3 and 4, but as a diffractive optical element 3*a*, for instance a Fresnel lens. Otherwise, the structure corresponds to that of FIG. 3, whereby the integrated circuit 6 is not represented in FIG. 4. The integration of a semiconductor structure 22 into the carrier plate 21 of the carrier for opto-electronic elements is also suitable for realizing a receiving device. In this case, the photodiode formed by the semiconductor structure 22 represents the photodiode of an optical receiver. The thickness of the semiconductor structure 22 is so realized that the structure substantially completely absorbs the light striking the carrier plate 21. This is achieved by selecting the thickness of the semiconductor structure 22 accordingly.

The structure represented in FIG. 4 can also represent the optical receiver. For example, light that is emitted from the butt of a non-illustrated optical fiber is focused by the Fresnel lens 3*a* onto the photodiode that is formed by the semiconductor structure 22. The resulting photocurrent is amplified by an electrical preamplifier 8, which is fastened to the carrier 2 and conductively connected to the metallizations 57*a*, 57*b* on the surface of the semiconductor structure, and fed to non-illustrated modules downstream.

Lastly, FIG. 5 represents an exemplifying embodiment wherein the semiconductor structure 22 forms a plurality of individually structured monitor diodes 9 which are configured in an array, which are schematically represented in FIG. 5. An array of light-emitting semiconductor elements, particularly VCSEL lasers which are realized in a transmitting module 11, is allocated to the monitor diodes 9. Each monitor diode 9 is receives the light of a transmitting diode 111, as is represented by two exemplary optical paths 4*a*, 4*b*. Each laser 111 of the laser array 11 can thus be monitored individually.

Schematically represented metallization contacts 57*a*, 57*b* serve for contacting the laser array 11 with interconnects that are realized on the surface of the semiconductor structure 22.

In order to produce a plurality of photodiodes 9 in an array, a solid semiconductor structure is first deposited on the carrier plate 21. The semiconductor structure is then isolated into individual regions by sawing, etching or the like, which regions are provided with separate metallizations and separately contacted. Alternatively, several semiconductor structures can be separately deposited next to one another on the carrier plate and separately structured.

The thickness of the carrier 2 equals 200 $\mu$m to 300 $\mu$m. The lateral spacing of the individual lasers is on the same order of magnitude.

It should be noted that the semiconductor structure can also be formed only on subregions of the carrier plate 21. Of course, several such subregions can also be provided on the carrier plate 21, with each subregion forming one or more photodiodes.

I claim:

1. A carrier for opto-electronic elements, comprising:

a carrier plate being transparent to emitted light from an opto-electronic element associated with said carrier plate; and at least one semiconductor structure deposited on said carrier plate, said semiconductor structure forming at least one photodiode and having a thickness such that less than 20% of incident light is absorbed and partly transmits the incident light.

2. The carrier according to claim 1, wherein:

said carrier plate has a side; and said semiconductor structure includes a layer having good conductivity disposed at least partly on said side of said carrier plate, a first semiconductor layer, and a second semiconductor layer.

3. The carrier according to claim 2, wherein said first semiconductor layer and said second semiconductor layer form a PN junction, and said layer with good conductivity forms a backside contact for said first semiconductor layer and adjoins said carrier plate.

4. The carrier according to claim 2, wherein said layer with good conductivity and said first and second semiconductor layers form a p-doped semiconductor layer, an n-doped semiconductor layer, and one of an intermediate lightly doped layer and an intrinsic layer.

5. The carrier according to claim 2, wherein said layer with good conductivity is formed from a doped semiconductor material.

6. The carrier according to claim 5, wherein said doped semiconductor material is a doped silicon.

7. The carrier according to claim 2, wherein said layer, said first semiconductor layer and said second semiconductor layer are formed from silicon.

8. The carrier according to claim 1, further comprising at least one metallization contact disposed on each of said layer and said second semiconductor layer, respectively, by way of which an electrical contacting of said layer and said second semiconductor layer is achieved.

9. The carrier according to claim 1, wherein attenuation of light impinging on said carrier plate is set by a thickness of said semiconductor structure.

10. The carrier according to claim 1, wherein said photodiode is a monitor diode of an optical transmitter, and said semiconductor structure only partially absorbs the incident light impinging on said carrier plate.

11. The carrier according to claim 1, wherein said carrier plate contains a beam shaping element.

12. The carrier according to claim 11, wherein said beam shaping element is a lens.

13. The carrier according to claim 1, wherein said carrier plate is formed of glass, quartz, plastic, sapphire, diamond or a semiconductor material which is transparent to radiation of the opto-electronic element.

14. The carrier according to claim 1, further comprising an antireflection layer applied on at least one side of said carrier plate.

15. The carrier according to claim 1, wherein said carrier plate and said semiconductor structure form a cuboidal carrier block.

16. The carrier according to claim 1, further comprising conductive tracks and appertaining contact pads formed on at least one of said carrier plate and said semiconductor structure, and serving for mounting at least one of electrical elements and the opto-electronic elements on the carrier.

17. The carrier according to claim 1, wherein said semiconductor structure is deposited on said carrier plate by at least one method selected from the group consisting of chemical deposition methods, physical deposition methods, epitaxy methods, chemical vapor deposition methods, vapor deposition methods, and sputtering methods.

18. The carrier according to claim 1, wherein said semiconductor structure forms a plurality of photodiodes in a one-dimensional or two-dimensional array.

19. The carrier according to claim 1, further comprising a beam shaping element connected to said carrier plate.

20. The transmitting device according to claim 19, wherein said beam shaping element is a lens.

21. The carrier according to claim 1, further comprising an antireflection layer applied on at least one side of said semiconductor structure.

22. The carrier according to claim 1, further comprising an antireflection layer applied on at least one side of said carrier plate and one side of said semiconductor structure.

23. An optical transmitting device, comprising:

at least one light-emitting opto-electronic element; and a carrier, containing:

a carrier plate being transparent to emitted or received light from said light-emitting opto-electronic element associated with said carrier; and at least one semiconductor structure deposited on said carrier plate, said semiconductor structure forming at least one monitor diode and having a thickness such that less than 20% of incident light is absorbed and partly transmits the incident light;

said light-emitting opto-electronic element having an emitting surface facing said carrier, so that light emitted by said light-emitting opto-electronic element passes through said monitor diode and said carrier plate.

24. The transmitting device according to claim 23, further comprising a beam shaping element, and said carrier plate has a side being averted from said semiconductor structure and connected with said beam shaping element.

25. The transmitting device according to claim 24, wherein said beam shaping element is a lens.

26. The transmitting device according to claim 24, wherein said carrier has interconnects and said light-emitting opto-electronic element is fastened on said carrier and conductively connected to said interconnects of said carrier by one of a flip chip mounting process and a conventional bonding process.

27. The transmitting device according to claim 26, further comprising additional components selected from the group consisting of electrical components and opto-electronic components, said additional components fastened to said carrier and conductively connected to said interconnects of said carrier.

28. The transmitting device according to claim 23, wherein said carrier plate has a side being averted from said semiconductor structure and a beam shaping element disposed on said side.

29. The transmitting device according to claim 28, wherein said beam shaping element is a lens.

30. The transmitting device according to claim 23, wherein said light-emitting opto-electronic element is one of a plurality of light-emitting semiconductor elements forming a transmitting array element, and said monitor diode is one of a plurality of monitor diodes disposed in said carrier, said monitor diodes being allocated to said transmitting array element, and each of said monitor diodes receives light from one of light-emitting semiconductor elements.

* * * * *